(12) United States Patent
Sun

(10) Patent No.: US 10,177,171 B2
(45) Date of Patent: Jan. 8, 2019

(54) DISPLAY PANELS HAVING A DIRECT CONTACT OF THE SOURCE OR DRAIN AND PIXEL ELECTRODE

(71) Applicant: Shenzhen China Star Optoelectronics Technology Co., Ltd., Shenzhen, Guangdong (CN)

(72) Inventor: Bo Sun, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 225 days.

(21) Appl. No.: 14/915,909

(22) PCT Filed: Jan. 29, 2016

(86) PCT No.: PCT/CN2016/072670
§ 371 (c)(1),
(2) Date: Mar. 2, 2016

(87) PCT Pub. No.: WO2017/117836
PCT Pub. Date: Jul. 13, 2017

(65) Prior Publication Data
US 2018/0053786 A1    Feb. 22, 2018

(30) Foreign Application Priority Data

Jan. 5, 2016  (CN) .......................... 2016 1 0009749

(51) Int. Cl.
*H01L 27/12* (2006.01)
*H01L 27/32* (2006.01)
(Continued)

(52) U.S. Cl.
CPC .......... *H01L 27/124* (2013.01); *G02F 1/1337* (2013.01); *G02F 1/1368* (2013.01);
(Continued)

(58) Field of Classification Search
CPC ............... H01L 27/124; H01L 27/1225; H01L 27/1262; H01L 29/41733; H01L 29/45;
(Continued)

(56) References Cited

U.S. PATENT DOCUMENTS 5,208,690 A * 5/1993 Hayashi ............ G02F 1/136227
257/347
5,815,223 A * 9/1998 Watanabe ........... G02F 1/13454
257/640
(Continued)

FOREIGN PATENT DOCUMENTS

CN    102723334 A    12/2013
CN    103441128 A    12/2013
(Continued)

*Primary Examiner* — Ida M Soward
(74) *Attorney, Agent, or Firm* — Andrew C. Cheng

(57) ABSTRACT

A display panels having a direct contact of the source or drain and pixel electrode. The display panels includes an array substrate. The array substrate includes a substrate and at least one TFT and at least one pixel electrode on the array substrate. The TFT includes a gate, a source, a drain, a gate insulation layer and a trench layer, the trench layer include an AS Island pattern and a doped layer, the source and the drain are arranged on the doped layer, and the AS Island pattern is arranged on the gate insulation layer. The source or the drain directly contacts with the pixel electrode without any material layers provided there between.

4 Claims, 4 Drawing Sheets

(51) Int. Cl.

| | | |
|---|---|---|
| *H01L 29/41* | (2006.01) | |
| *H01L 29/45* | (2006.01) | |
| *H01L 29/66* | (2006.01) | |
| *H01L 29/78* | (2006.01) | |
| *G02F 1/13* | (2006.01) | |
| *G02F 1/1337* | (2006.01) | |
| *G02F 1/1343* | (2006.01) | |
| *G02F 1/1368* | (2006.01) | |
| *H01L 29/417* | (2006.01) | |
| *H01L 29/786* | (2006.01) | |
| *G02F 1/1362* | (2006.01) | |
| *G02F 1/1333* | (2006.01) | |

(52) U.S. Cl.
CPC .... *G02F 1/13439* (2013.01); *G02F 1/134309* (2013.01); *H01L 27/12* (2013.01); *H01L 27/1225* (2013.01); *H01L 27/1262* (2013.01); *H01L 29/41733* (2013.01); *H01L 29/45* (2013.01); *H01L 29/66969* (2013.01); *H01L 29/7869* (2013.01); *G02F 1/136286* (2013.01); *G02F 2001/133397* (2013.01); *G02F 2001/136295* (2013.01); *G02F 2201/123* (2013.01); *G02F 2203/30* (2013.01); *H01L 27/3248* (2013.01)

(58) Field of Classification Search
CPC ........... H01L 29/66969; H01L 29/7869; H01L 1/1337; H01L 29/134309; H01L 29/13439; H01L 29/1368; H01L 27/3248
See application file for complete search history.

(56) References Cited

U.S. PATENT DOCUMENTS

| | | | | |
|---|---|---|---|---|
| 5,994,721 A * | 11/1999 | Zhong | ............... | G02F 1/136213 257/440 |
| 6,121,632 A * | 9/2000 | Taguchi | ............. | H01L 27/1244 257/57 |
| 6,485,997 B2 * | 11/2002 | Lee | ................. | G02F 1/134363 438/158 |
| 7,488,982 B2 * | 2/2009 | So | ..................... | H01L 27/3248 257/347 |
| 7,884,542 B2 * | 2/2011 | Sung | ................. | H01L 27/1214 313/506 |
| 7,981,708 B1 * | 7/2011 | Lee | ..................... | H01L 27/1225 257/59 |
| 8,153,468 B2 * | 4/2012 | Seo | .................... | H01L 27/3248 257/40 |
| 8,241,933 B2 * | 8/2012 | Lee | .................... | H01L 27/3276 257/40 |
| 8,405,161 B2 * | 3/2013 | Park | ................... | H01L 27/1214 257/401 |
| 8,643,010 B2 | 2/2014 | Matsukizono | | |
| 8,772,781 B2 * | 7/2014 | Hoka | ............... | H01L 29/41733 257/57 |
| 9,117,768 B2 * | 8/2015 | Cho | .................... | H01L 27/127 |
| 9,461,075 B2 * | 10/2016 | Yu | ..................... | G02F 1/136286 |
| 9,484,442 B2 * | 11/2016 | Sugawara | ........ | H01L 29/66969 |
| 9,502,570 B2 * | 11/2016 | Liu | .................. | H01L 29/42384 |
| 9,741,861 B2 * | 8/2017 | Woo | .................. | H01L 29/7869 |
| 9,818,605 B2 * | 11/2017 | Yan | .................. | H01L 21/02554 |
| 9,893,129 B2 * | 2/2018 | Qi | ....................... | H01L 27/3248 |
| 2002/0093019 A1 * | 7/2002 | Hirabayashi | .......... | G02F 1/1368 257/71 |
| 2004/0256979 A1 * | 12/2004 | Murakami | .......... | H01L 27/3248 313/503 |
| 2008/0048191 A1 * | 2/2008 | Son | ..................... | H01L 27/3248 257/72 |
| 2008/0074044 A1 * | 3/2008 | Huang | ............... | H01L 27/3246 313/504 |
| 2008/0158457 A1 | 7/2008 | Park et al. | | |
| 2011/0006290 A1 | 1/2011 | Noh et al. | | |
| 2013/0023086 A1 * | 1/2013 | Chikama | ............ | G02F 1/1368 438/104 |
| 2013/0109120 A1 * | 5/2013 | Choi, II | ............ | G02F 1/134363 438/34 |
| 2014/0209895 A1 | 7/2014 | Wang et al. | | |
| 2015/0137116 A1 | 5/2015 | Xu et al. | | |
| 2017/0117499 A1 * | 4/2017 | Zhang | ................ | H01L 51/5218 |
| 2017/0255044 A1 * | 9/2017 | Ge | ...................... | G02F 1/13439 |

FOREIGN PATENT DOCUMENTS

| | | |
|---|---|---|
| CN | 103943636 A | 7/2014 |
| CN | 104570523 A | 4/2015 |

* cited by examiner

US 10,177,171 B2

DISPLAY PANELS HAVING A DIRECT CONTACT OF THE SOURCE OR DRAIN AND PIXEL ELECTRODE

BACKGROUND OF THE INVENTION

1. Field of the Invention

The present disclosure relates to display technology, and more particularly to an array substrate and the manufacturing method and the display panel thereof.

2. Discussion of the Related Art

Thin film transistor (TFT) LCD is driven by a TFT matrix. When scanning lines of the LCD turn on the TFT active layer, the signals of the data line are transmitted to the source via a trench layer. Afterward, the signals are then transmitted to pixel electrodes via the source. In this way, the corresponding grayscale is displayed when the liquid crystal layer is controlled by the pixel electrodes.

Conventionally, a passivation layer (PV) is arranged on the active layer, wherein at least one via hole is arranged on the passivation layer. The source is electrically connected with the pixel electrode via the via hole. Due to the resistance, it may be slow to write the signals, and the charging rate of the pixels may be decreased. In addition, image sticking may occur due to the decreased charging rate.

SUMMARY

The present disclosure relates to an array substrate, and the manufacturing method and the display panel thereof, which may increase the charging current so as to enhance the charging rate.

In one aspect, a display panel includes: an array substrate includes a substrate and at least one TFT and at least one pixel electrode on the array substrate, the TFT includes a gate, a source, and a drain; and wherein the source or the drain directly contacts with the pixel electrode without any material layers provided therebetween.

Wherein the pixel electrode is arranged on a surface of the source or the drain to directly contact with the source or the drain.

Wherein the pixel electrode and the source or the drain are on the same layer so as to contacts directly with each other.

Wherein the pixel electrode and the directly contacted source or drain are made by transparent conductive films.

Wherein the display panel further includes an alignment layer covering the source, the drain and the pixel electrode.

Wherein the TFT further includes a gate insulation layer and a trench layer overlapped on the gate, and the source and the drain are arranged on the trench layer.

In another aspect, an array substrate includes: a substrate and at least one TFT and at least one pixel electrode on the substrate, the TFT includes a gate, a source, and a drain; and wherein the source or the drain directly contacts with the pixel electrode without any material layers provided therebetween.

In another aspect, a manufacturing method of array substrates includes: forming a TFT on a substrate, wherein the TFT includes a gate, a source, and a drain; forming a pixel electrode on the gate or the source of the TFT, wherein the source or the drain directly contacts with the pixel electrode without any material layers provided therebetween.

Wherein the step of forming the pixel electrode on the gate or the source of the TFT further includes: forming the pixel electrode on the surfaces of the source or the drain; or forming the pixel electrode on the same layer with the source or the drain.

Wherein the method further includes: covering an alignment layer on the source, the drain and the pixel electrode.

In view of the above, the source or the drain directly contact with the pixel electrode without other material layer provided therebetween, such that the resistance between the source/drain and the pixel electrode is decreased. When the signals are written from the source/drain to the pixel electrode, the writing speed is enhanced. That is, the charging current is increased, and the charging rate is enhanced. In addition, the charging rate may be guaranteed, which may resolve the conventional issues caused by the deficiency of charging rate.

DETAILED DESCRIPTION OF THE EMBODIMENTS

The following description including proposed system architecture, interfaces, and specific details and the like, are examples for illustrating the present disclosure. However, those skilled in the art, in the absence of such specific details, other embodiments of the present disclosure may also be implemented. In other instances, detailed descriptions are omitted for conventional devices, circuits, and methods, so as to avoid unnecessary detail description of the present application.

Figure 1:
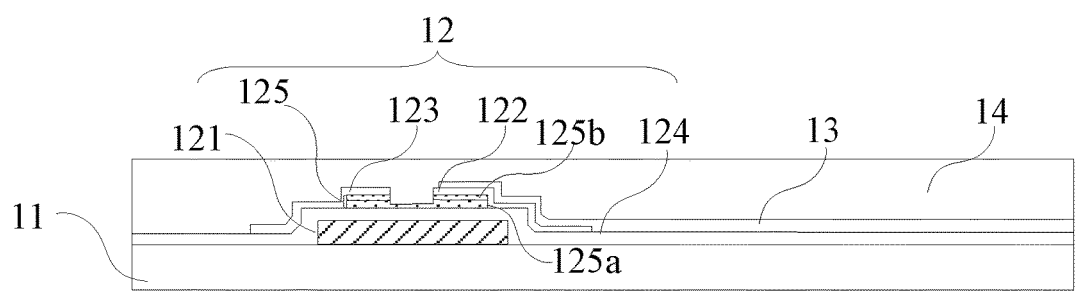
FIG. 1 is a schematic view of the array substrate in accordance with one embodiment.

FIG. 1 is a schematic view of the array substrate in accordance with one embodiment. In the embodiment, the array substrate includes a substrate 11, and a TFT 12 and a pixel electrode 13 arranged on the substrate 11. It can be understood that though there is only one TFT and one pixel electrode are shown in FIG. 1, the array substrate may include a plurality of TFTs and pixel electrodes in real scenarios. The first array substrate 12 includes a gate 121, a source 122, and a drain 123. Other material layer is not configured between the source 122/the drain 123 and the pixel electrode 13. That is, the source 122 and the drain 123 directly contact with the pixel electrode 13. Thus, the via holes are not needed, and the resistance between the source and the pixel electrode is decreased such that the charging current is increased and the charging rate is enhanced.

In the embodiment, one example, wherein the source 122 directly contacts with the pixel electrode 13, will be described hereinafter.

Specifically, the pixel electrode 13 is arranged on a surface of the source 122 so as to directly contact with the source 122. As shown in FIG. 1, the pixel electrode 13 is deposited on a top surface of the source 122. At this moment, when the source 122 receives the signals of the data lines, the signals are written to the pixel electrode 13 directly via the top surface of the source, which enhances the charging rate.

Figure 2:
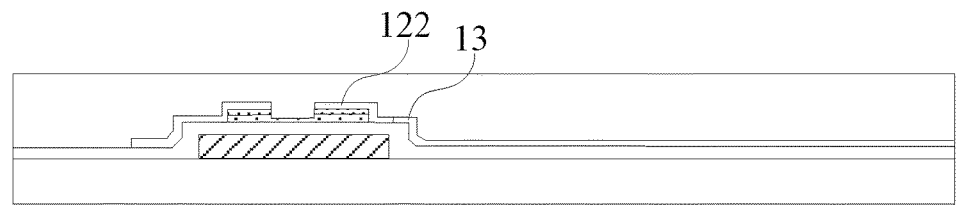
FIG. 2 is a schematic view of the array substrate in accordance with another embodiment.

In another example, the pixel electrode 13 and the source 122 may be arranged on the same layer. The pixel electrode 13 directly contacts with a lateral side of the source 122. As shown in FIG. 2, the structure shown in FIG. 2 is similar to that in FIG. 1, and thus the descriptions are omitted hereinafter. At this moment, when the source 122 receives the signals of the data lines, the signals are written to the pixel electrode 13 directly via the lateral side of the source, which enhances the charging rate.

Further, in order to increase the aperture rate of the pixel electrode, the pixel electrode 13 and the source 122 may be made by transparent thin films, such as ITO. It can be understood that, with respect to the TFT, a source layer is not configured. Instead, a pixel electrode layer is configured directly, and the pixel electrode 13 operates as the source 122 of the TFT, and receives the signals of the data line via the trench layer. At the same time, the pixel electrode 13 operates as the pixel electrode for aligning the liquid crystal layer so as to display the corresponding grayscale.

It can be understood that, in addition to the above structure, the source 122 and the pixel electrode 13 may be configured to contact with each other directly via other structures, and is not limited to the above disclosure.

Preferably, in one example, the passivation layer may be omitted. An alignment layer 14 is arranged on the source 122, the drain 123, and the pixel electrode 13. The alignment layer 14 replaces the passivation layer of the conventional array substrate, and is configured for protecting the source 122, the drain 123, and the pixel electrode 13 from being oxidized. In addition, the alignment layer 14 is configured with an alignment direction for anchoring a pretilt angle. As the passivation layer is not needed for the array substrate, the corresponding materials and the masking process are omitted. As such, the array substrate may be manufactured in a thin and light manner.

It is to be noted that, the alignment layer 14 directly covers the top surfaces of the pixel electrode 13 and the drain 123 and the portion of the top surface of the source 122 not covered by the pixel electrode 13. For instance, when the pixel electrode 13 completely covers the source 122, the alignment layer 14 covers the top surfaces of the drain 123 and the pixel electrode 13. In addition, when the pixel electrode 13 and the source 122 are on the same layer, the pixel electrode 13 covers the top surfaces of the source 122, the drain 123, and the pixel electrode 13.

Further, in the above embodiments, the source and the pixel electrode are connected. In other embodiments wherein the drain and the pixel electrode are connected, other material layers may be omitted such that the drain and the pixel electrode are directly connected.

In the embodiment, the TFT 12 further includes a gate insulation layer 124 and a trench layer 125. The source 122 and the drain 123 are arranged on the trench layer 125. The gate insulation layer 124 overlaps between the gate 121 and the trench layer 125 to insulate the gate 121 from the trench layer 125. The source 122 and the drain 123 are on the same layer above the trench layer 125. When the voltage obtained by the gate 121 is larger than or equals to a turn-on voltage, the trench layer 125 releases the electrons to connect the source 122 and the drain 123. The gate insulation layer 124 may be AlN films, and the trench layer 125 may be made by metallic oxide, such as indium gallium zinc oxide (IGZO). Specifically, the trench layer 125 may include an array substrate (AS) AS Island pattern 125a and a doped layer 125b.

In the above embodiments, the substrate 11 may be a glass substrate or a transparent substrate made by other insulation materials. The gate 121 may be made by Mo layer. The source 122 and the drain 123 may be formed by overlapping an Mo layer, an aluminum layer, and the Mo layer, or by overlapping the Mo layer, a first cooper layer, a second cooper layer, and the Mo layer, wherein the power of depositing the first cooper layer is larger than the power of depositing the second cooper layer.

In one embodiment, a display panel includes the above array substrate.

Figure 3:
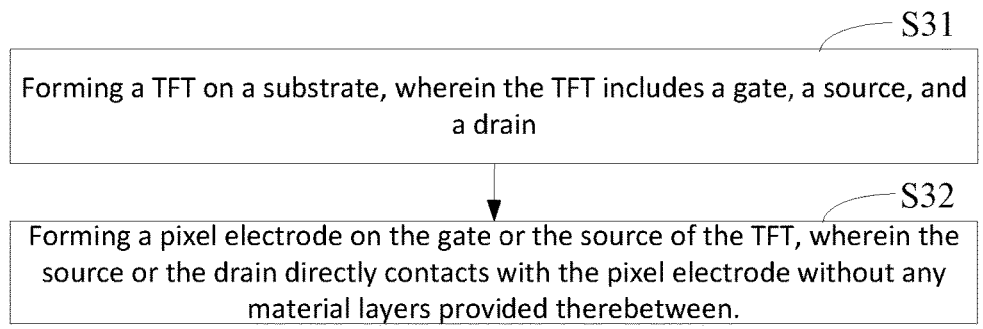
FIG. 3 is a flowchart illustrating the manufacturing method of the array substrate in accordance with one embodiment.

FIG. 3 is a flowchart illustrating the manufacturing method of the array substrate in accordance with one embodiment. The method includes the following steps:

In step S31, forming a TFT on a substrate, wherein the TFT includes a gate, a source, and a drain.

As shown in FIGS. 4a-4d, the gate 421 is formed on the substrate 41. A gate insulation layer 424 is formed on the gate 421, a trench layer 425 is arranged on the gate insulation layer 424, and a source 422 and a drain 423 are respectively formed on the trench layer 425, wherein the source 422 and the drain 423 are isolated from each other. Specifically, the patterns of the gate 421, the source 422, and the drain 423 are formed by etching processes, such as wet or dry etching processes.

Alternatively, the source and the drain are formed by overlapping the Mo layer, the aluminum layer, and the Mo layer, or by overlapping the Mo layer, a first cooper layer, a second cooper layer, and the Mo layer, wherein the power of depositing the first cooper layer is larger than the power of depositing the second cooper layer.

In step S32, forming a pixel electrode on the gate or the source of the TFT, wherein the source or the drain directly contact with the pixel electrode without any material layers provided therebetween.

Figure 4A:
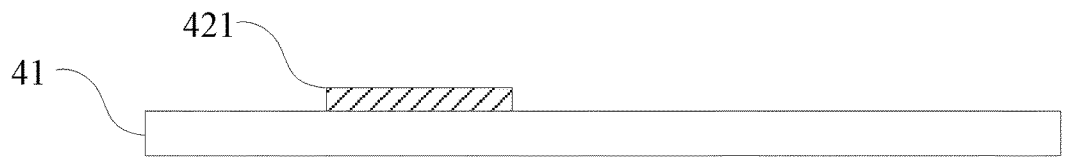
FIG. 4a is a schematic view of the gate formed by the manufacturing method of the array substrate in accordance with one embodiment.
Figure 4B:
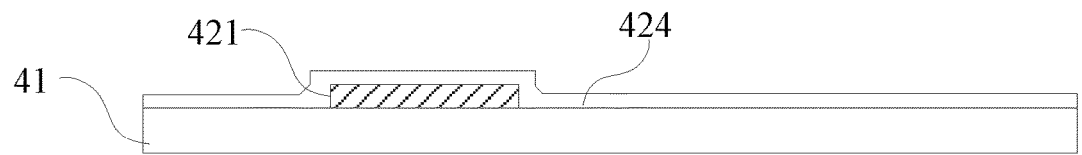
FIG. 4b is a schematic view of the gate insulation layer formed by the manufacturing method of the array substrate in accordance with one embodiment.
Figure 4C:
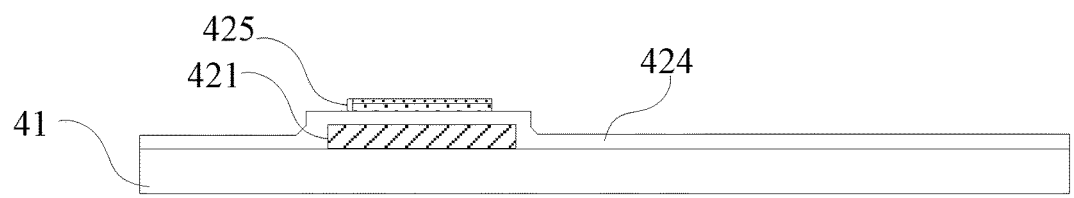
FIG. 4c is a schematic view of the gate trench layer formed by the manufacturing method of the array substrate in accordance with one embodiment.
Figure 4D:
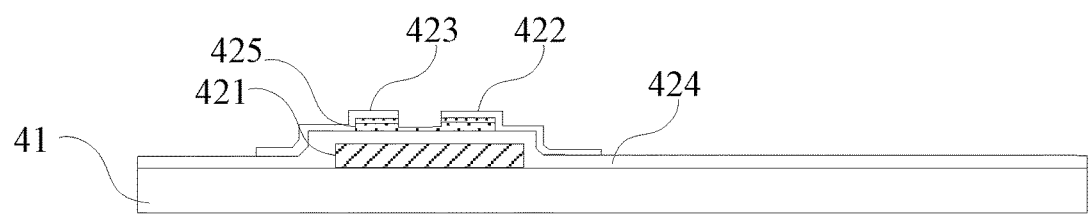
FIG. 4d is a schematic view of the source and the drain formed by the manufacturing method of the array substrate in accordance with one embodiment.
Figure 4E:
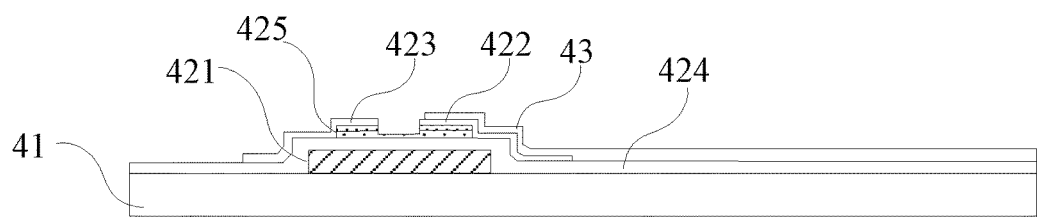
FIG. 4e is a schematic view of the pixel electrode formed by the manufacturing method of the array substrate in accordance with one embodiment.
Figure 4F:
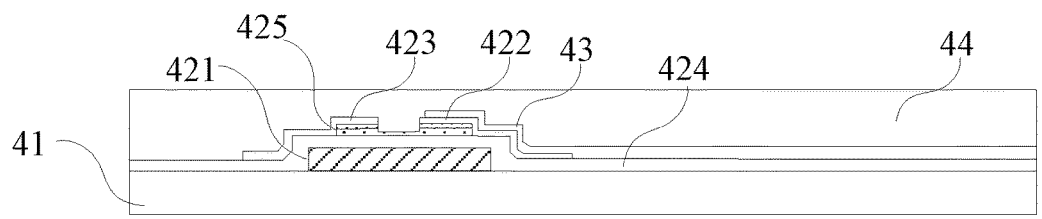
FIG. 4f is a schematic view of the alignment layer formed by the manufacturing method of the array substrate in accordance with one embodiment.

In the embodiment, the source and the pixel electrode are connected, and the pixel electrode is arranged on the top surface of the source. As shown in FIGS. 4e-4f, the pixel electrode 43 is formed on the source 422, wherein the pixel electrode 43 is deposited on the top surface of the pixel electrode 43, and the pixel electrode 43 is patterned. Afterward, an alignment layer 44 is coated on the surfaces of the drain 423 and the pixel electrode 43. The alignment direction may be configured by unidirectional rubbed. In this way, the alignment layer 44 may operate as the passivation layer and the alignment layer at the same time.

It can be understood that, in that embodiments, the source and the pixel electrode may be configured at the same layer. As shown in FIG. 2, after the source is formed, the pixel electrode is formed on the gate insulation layer so as to directly contact with the lateral side of the source.

Further, when the source and the pixel electrode are configured as the transparent conductive film, the source and the pixel electrode may be formed at the same time in the above steps.

In view of the above, the source or the drain directly contact with the pixel electrode without other material layer provided therebetween, such that the resistance between the source/drain and the pixel electrode is decreased. When the signals are written from the source/drain to the pixel electrode, the writing speed is enhanced. That is, the charging current is increased, and the charging rate is enhanced. In addition, the charging rate may be guaranteed, which may resolve the conventional issues caused by the deficiency of charging rate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display panel, comprising:
    an array substrate comprises a substrate and at least one TFT and at least one pixel electrode on the array substrate, the TFT comprises a gate, a source, and a drain; and
    wherein the source or the drain directly contacts with the pixel electrode without any material layers provided therebetween;
    wherein the pixel electrode and the source or the drain are on the same layer so as to contacts directly with each other;
    wherein the pixel electrode and the directly contacted source or drain are made by transparent conductive films; and
    wherein the TFT further comprises a gate insulation layer and a trench layer overlapped on the gate, the trench layer include an AS Island pattern and a doped layer, the source and the drain are arranged on the doped layer, and the AS Island pattern is arranged on the gate insulation layer.

2. The display panel as claimed in claim 1, wherein the display panel further comprises an alignment layer covering the source, the drain and the pixel electrode.

3. An array substrate, comprising:
    a substrate and at least one TFT and at least one pixel electrode on the substrate, the TFT comprises a gate, a source, and a drain; and
    wherein the source or the drain directly contacts with the pixel electrode without any material layers provided therebetween;
    wherein the pixel electrode and the source or the drain are on the same layer so as to contacts directly with each other;
    wherein the pixel electrode and the directly contacted source or drain are made by transparent conductive films; and
    wherein the TFT further comprises a gate insulation layer and a trench layer overlapped on the gate, the trench layer include an AS Island pattern and a doped layer, the source and the drain are arranged on the doped layer, and the AS Island pattern is arranged on the gate insulation layer.

4. The array substrate as claimed in claim 3, wherein the display panel further comprises an alignment layer covering the source, the drain and the pixel electrode.

* * * * *